United States Patent [19]

Tsao et al.

[11] Patent Number: 4,481,281
[45] Date of Patent: Nov. 6, 1984

[54] POLYMER COMPOSITION HAVING TERMINAL ALKENE AND TERMINAL CARBOXYL GROUPS

[75] Inventors: Jung-Hsien Tsao, Marietta; Paul R. Hein, Atlanta, both of Ga.

[73] Assignee: W. R. Grace & Co., Cambridge, Mass.

[21] Appl. No.: 426,411

[22] Filed: Sep. 29, 1982

Related U.S. Application Data

[62] Division of Ser. No. 225,809, Jan. 16, 1981, Pat. No. 4,422,914.

[51] Int. Cl.$^3$ .................... C07C 125/073; G03C 1/70
[52] U.S. Cl. ................................. 430/284; 430/286; 430/927; 430/288; 430/916; 525/440; 525/455; 525/920; 560/25; 560/26; 560/158; 204/159.19
[58] Field of Search ................ 525/920, 440, 455; 204/159.19, 159.15; 430/281, 286, 284, 906, 927, 935, 921, 923, 916; 560/25, 26, 158

[56] References Cited

U.S. PATENT DOCUMENTS

| | | | |
|---|---|---|---|
| 3,713,864 | 1/1971 | Ackerman et al. | 204/159.19 |
| 3,715,293 | 12/1977 | Sandner et al. | 430/285 |
| 3,801,329 | 12/1977 | Sandner et al. | 430/281 |
| 3,809,732 | 5/1974 | Chandross et al. | 430/321 |
| 3,850,770 | 4/1973 | Kiyoshi et al. | 430/284 |
| 3,890,150 | 9/1973 | Hasegawa et al. | 430/283 |
| 3,953,214 | 5/1974 | Lipson et al. | 430/281 |
| 3,954,584 | 2/1975 | Miyata et al. | 430/284 |
| 4,038,078 | 7/1977 | Sakurai et al. | 430/281 X |
| 4,162,274 | 12/1976 | Rosenkranz | 430/286 |
| 4,164,486 | 1/1978 | Kudo et al. | |
| 4,167,415 | 12/1977 | Higuchi et al. | 430/286 X |
| 4,170,481 | 11/1977 | Okazaki et al. | 430/286 |
| 4,218,295 | 5/1979 | Lee | 204/159.14 |
| 4,228,232 | 2/1979 | Rousseau | 430/286 X |
| 4,283,480 | 8/1981 | Davies | 204/159.19 X |

FOREIGN PATENT DOCUMENTS

| | | |
|---|---|---|
| 1289075 | 9/1972 | United Kingdom . |
| 1489425 | 10/1977 | United Kingdom . |
| 1507808 | 4/1978 | United Kingdom . |
| 1519013 | 7/1978 | United Kingdom . |
| 2002531 | 2/1979 | United Kingdom . |
| 2034492 | 6/1980 | United Kingdom . |
| 2070634 | 9/1981 | United Kingdom . |

*Primary Examiner*—John E. Kittle
*Assistant Examiner*—Cynthia Hamilton
*Attorney, Agent, or Firm*—Carole F. Barrett; William L. Baker; Michael J. McGreal

[57] ABSTRACT

A polymer composition comprising a urethane having terminal unsaturation and a terminal carboxyl group and which is capable of further free radical polymerization has been synthesized. This polymer can be a liquid or a solid depending on the molecular weight and backbone of the polymer. This polymer as a liquid has been found to be very useful in producing printed circuit boards by photo resist processes.

9 Claims, No Drawings

POLYMER COMPOSITION HAVING TERMINAL ALKENE AND TERMINAL CARBOXYL GROUPS

This application is a division of application Ser. No. 225,809 filed Jan. 16, 1981 now U.S. Pat. No. 4,422,914.

This invention relates to a new polymer composition and the use of this polymer composition alone and in conjunction with other materials as a photo resist. More particularly, it has been found that a urethane polymer having terminal unsaturation at one end and a terminal carboxyl group at the other end is very useful in making printed circuit boards by etch or plate resist processes and can also be used as a solder mask.

In making a printed circuit board by dry film photo resist methods, a solid photo sensitive material is adhered to the printed circuit board blank. An image bearing negative of the desired circuit is placed on this photo sensitive material and the photo sensitive material exposed to light. The light, on striking certain areas of the photo sensitive material, changes it so that the material which has not been exposed to the light and that which has been exposed exhibit differing characteristics, such as solubility. The unexposed photo sensitive material is the usually removed from the circuit board blank. There are then left areas coated with a solid polymer and areas uncoated. The uncoated areas can be coated with solder or the underlying conductive material can be removed. The solid polymer remaining on the circuit board is then usually removed in a subsequent step.

The usual wet photo resist methods for making printed circuit boards consist of screen printing a liquid polymer composition onto the circuit board blank and then exposing the blank to radiation sufficient to cure and solidify the polymer. The cured polymer is then available to protect the underlying metal layer during one or more of the subsequent processing steps. Where a small number of printed circuit boards of a particular design are to be made, hand screen printing is used. When large numbers of a given circuit design are to be made, machine screen printing of the desired circuit design is used.

The essence of photo resist processes is the use of a material which after exposure to light can be removed from certain parts of the circuit board blank, but not from other areas. The material must also be capable of sharp resolution, i.e., it must be a material where the exposed areas and the unexposed areas are clearly and sharply defined. In order to get this sharp definition, those in the prior art have previously used solid photo sensitive compositions, and in the instances where a liquid was coated onto a circuit board blank, it was dried before any imaging. One reason for using a solid or a dried material was that it was felt that the image of the desired circuit had to be in direct contact with the photo resist in order to get sharp definition in the final circuit. However, this has been found not to be the case. It is possible to have an air gap between the negative or other image of the circuit and the photo resist and still produce printed circuits with sharp definition. This discovery has led to the feasible use of liquid polymers as photo resists.

These polymers also have uses other than as photo resists. They can be used as protective coatings, and particularly in areas subject to graffiti in the nature of spray painting or liquid pencil notations or drawings. If a surface which has been treated with these polymers and cured, is subsequently coated with spray paint and pencil art, the polymer coating, along with the spray paint and pencil, can be removed by a caustic stripping. This is but exemplary of a way these polymers can be used for other than a photo resist.

In brief summary, the polymer which has been synthesized is a urethane which has terminal alkene unsaturation and a terminal carboxyl group. This polymer has the general formula:

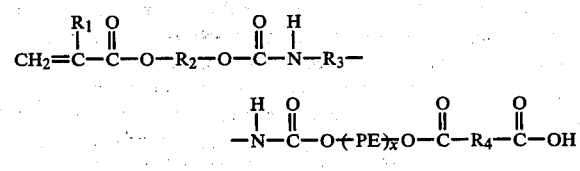

wherein $R_1$ is hydrogen, methyl or ethyl, $R_2$ is an alkyl group of from 1 to 6 carbon atoms, $R_3$ is the diisocyanate moiety and can be alicyclic, aryl, alkyl or arylalkyl in structure and $R_4$ is alkyl, alkylene, aryl or alkyl or hydroxy substituted aryl, and $(PE)_x$ is a polyester and/or polyether chain extender unit where X is an integer of from 2 to 50. The terminal bifunctionality of this polymer is very unique in that it makes possible many uses, and in particular, the use as a photo resist. In use as a photo resist, the terminal alkene group provides the capability for free radical polymerization while the carboxyl group provides for stripability using alkaline solutions. That is, the same molecular unit is curable by actinic light radiation, and after being cured, is susceptable to stripping using alkaline solutions.

These polymers can be synthesized in various ways. However, a preferred route is to react a diisocyanate with an hydroxy terminated acrylate or methacrylate to form a monoisocyanate urethane adduct. This acrylate or methacrylate provides the terminal alkene unsaturation of the final polymer composition. The urethane adduct with terminal alkene unsaturation and a terminal isocyanate is then reacted with a chain extending polyester and/or polyether to produce an hydroxyl terminated urethane. It is also contemplated to use polyester-polyether mixtures. This reaction consumes the remaining isocyanate content of the urethane adduct. The hydroxyl terminated urethane is then reacted with an anhydride which provides the terminal carboxyl group of the polymer. When the anhydride is an unsaturated anhydride such as maleic anhydride, there is produced unsaturation α to the carboxyl group.

In more detail, these alkene and carboxyl terminated polymers have a molecular weight in the range of about 250 to 10,000 and an acid content of about 0.1 to 4.0 meq/g. In synthesizing these polymers, any diisocyanate which can produce a polymer having the above general structure can be used. This diisocyanate has the general formula $R(NCO)_2$, where R is a polyvalent organic moiety free from reactive carbon to carbon unsaturation. Preferred diisocyanates are hexamethylenediisocyanate, toluene diisocyanate, xylylene diisocyanate, diphenylmethane diisocyanate, phenylene diisocyanate, naphthalene diisocyanate, Hylene W, isophorone diisocyanate. The hydroxy terminated acrylate or methacrylate which is reacted with the diisocyanate is utilized to provide the terminal alkene unsaturation of the polymer. Other than that the hydroxy group must be available for reaction with the diisocyanate any hydroxyalkyl acrylate or hydroxyalkyl methacrylate can be used. Non-limiting examples of useful hydroxy terminated acrylates and methacrylates are hydroxyethyl acrylate, hydroxypropyl acrylate, hydroxybutyl acrylate, hydroxyisobutyl acrylate, hydroxyisopentyl acrylate, hydroxyhexyl acrylate, and hydroxyethyl methacrylate, hydroxypropyl methacrylate, hydroxybutyl methacrylate, hydroxyisobutyl methacrylate, and hydroxypentyl methacrylate.

The diisocyanate and the hydroxy terminated acrylate or methacrylate are reacted. A catalyst is preferably used in the reaction and can be admixed with the diisocyanate. Suitable catalysts are urethane catalyst such as dibutyl tin dilaurate or stannous octoate. A catalyst promotor such as an organic phosphite can also be used. The hydroxy terminated acrylate or methacrylate is added slowly to the diisocyanate and the exotherm is controlled so that the temperature of the mixture does not exceed about 85° C., and preferably does not exceed about 70° C. The reaction is complete when essentially all of the hydroxyl groups of the acrylate or methacrylate have been reactively consumed. This point can be checked by titrating a sample of the reacted solution with dibutylamine to determine the remaining isocyanate content of the diisocyanate.

After it is determined that the required amount of isocyanate content has been consumed, a polyester and/or polyether is added. This polyester or polyether function primarily as a chain extender and can be any polyester or polyether having a molecular weight of about 250 to 10,000. The polyester and polyether can have essentially any structure as long as it contains an hydroxyl group which is reactive with the remaining isocyanate group of the diisocyanate and an hydroxyl group which is reactive with an anhydride such as maleic anhydride. Suitable chain extending polymers are poly (diethyleneglycol adipate), poly (ethylene glycol adipate), poly (ethylene oxide), poly (propylene oxide), poly (tetra methylene oxide), poly (ethylene oxide-propylene oxide) copolymer, poly (nonamethylene oxide), poly (caprolactone) and poly (trimethylolpropane-propylene oxide). There are yet many other polyethers and polyesters which could be used in the synthesis of the present polymers. The only requirement is that the polyester or polyether have the reactive capability at one end to undergo reaction with an isocyanate group, and at the other end, have the reactive capability to undergo reaction with a cyclic anhydride.

A sufficient amount of chain extending polymer is added to reactively consume the remaining isocyanate group. Since this is a urethane reaction any suitable urethane catalyst such as that used in the reaction of the hydroxy terminated acrylate or methacrylate with the diisocyanate, can be used.

This reaction mixture is maintained at about 50° C. to 90° C., and preferably about 65° C. to 70° C. for about 4 to 8 hours. Reaction of the remaining diisocyanate group is then complete. The degree of reaction completion can be determined by titration. The polymer molecule at this stage has terminal unsaturation at one end and a terminal hydroxyl on the other. This terminal hydroxyl group is reacted with a cyclic anhydride, such as maleic anhydride, succinic anhydride, citraconic anhydride, tetrahydrophthalic anhydride and hexahydrophthalic anhydride, to cap that end of the polymer with a carboxyl group. When an anhydride such as maleic anhydride is used, the polymer will have unsaturation α to the carboxyl group. Preferably an esterification catalyst such as dibutyl tin dilaurate is used to promote reaction. Stannous octoate, tertiary amines such as triethyl amine or any other esterification catalyst can also be used. The reaction mixture is maintained at about 50° to 90° C. until the anhydride content of the reaction mixture has been exhausted. This point of completion of reaction can be determined by infrared analysis. The polymer product has an acid content of about 0.1 to 4 meg/g. Whether the synthesized polymer will be a liquid or a solid is determined by the chain length and molecular weight of the —(PE)$_x$— unit and the structure of the diisocyanate.

In a modification of the process for making polymers, suitable for use as a photo resist, an additive copolymer can be synthesized along with the polymer. Suitable additive copolymers are carboxy terminated acrylates and methacrylates. These additive copolymers aid in the control of the urethane polymer viscosity and in control of the stripping ease of the cured polymer. These have the general formula:

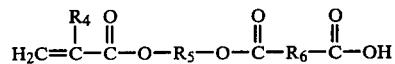

where $R_4$ is hydrogen, methyl or ethyl and $R_5$ is alkyl of from 1 to 6 carbon atoms and $R_6$ is alkyl, alkylene, aryl or alkyl or hydroxy substituted aryl. Most conveniently, this additive copolymer is prepared by co-synthesizing it along with the polymer. This is carried out by admixing an hydroxy alkyl acrylate or methacrylate with the partially synthesized polymer prior to the final step of reaction with the anhydride. Preferred hydroxy alkyl acrylates and methacrylates are hydroxyethyl acrylate, hydroxypropyl acrylate, hydroxybutyl acrylate, hydroxyethyl methacrylate, hydroxypropyl methacrylate, and hydroxybutyl methacrylate. In this modification the anhydride is added to cap the polymer and to react with the hydroxyalkyl acrylate or methacrylate. In the reaction sequence, the anhydride will react with the hydroxyl group of the hydroxyalkyl acrylate or methacrylate and with the hydroxyl group of the urethane polymer being synthesized. The result is that both molecules have the same bifunctionality and, as such, are highly compatable. This co-synthesis also produces a very intimately intermixed polymer.

In yet another modification of the process for making these polymers a compound to modify the hardness of the cured alkene and carboxy terminated polymer can be co-synthesized along with the alkene and carboxy terminated polymer. Such compounds have the general formula:

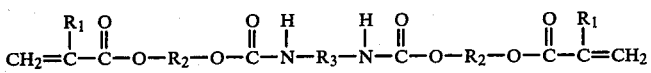

wherein, $R_1$, $R_2$, and $R_3$ are the same as for the alkene and carboxy terminated polymer. In order to co-synthesize this compound, the reactant concentrations of diisocyanate and of the hydroxy terminated acrylate or methacrylate in the step of synthesizing the alkene and carboxy terminated polymer are adjusted so as to produce the desired amount of the above compound. That is one additional mole of diisocyanate and two additional moles of hydroxy terminated acrylate or methacrylate are added in the first step of the above described preferred reaction sequence.

Considering the various reactants which can be used to make the present alkene and carboxy terminated polymers, it is not unexpected that the various polymers besides being photopolymerizable and stripable using alkaline solutions, would exhibit other properties. However, it was not expected that there could be produced a readily photopolymerizable and alkaline stripable hot melt composition. That is, a polymer composition which can be melted and applied to a substrate as a melt, cooled to a solid, and selectively contacted with actinic light to cure the polymer in certain areas. The uncured polymer can be removed by means of an alkaline rinse or heating the substrate to melt the uncured polymer so that it can be removed as a liquid. Such hot melt polymers have the following general structure:

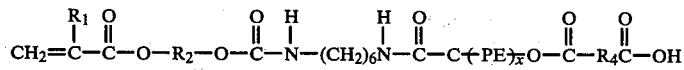

wherein $R_1$, $R_2$, $-PE)_{\overline{x}}$ and $R_4$ each have the same meaning as set forth above. In essence the discovery with regard to hot melt compositions resides primarily in the use of hexamethylene diisocyanate as the reactive diisocyanate.

In the use of these alkene and carboxyl terminated polymers as photopolymerizable compositions a photoinitiator is used along with the actinic light for polymerization. Useful photoinitiators are benzophenone, acetophenone, acenaphthenequinone, o-methoxybenzophenone, dibenzosuberone, anthraquinone, hexanophenone and 2,2 dimethoxy-2-phenyl acetophenone. Further, any other photoinitiator which would promote free radical polymerization of the acrylate group could be used.

Depending on the specific intended use for the alkene and carboxy terminated polymers other materials besides those already set out are used. For instance if it is desired to thicken the polymer to make a screen-printable ink a thickening agent such as talc, Modaflow, Syloid, Cabosil or Aerosil is added. Other additives which can be incorporated into the compositions are epoxy acrylates, multifunctional acrylates, such as hexanediol diacrylate, a multifunctional thiol such as pentaerythritol-tetra-kis (B-mercaptopropionate) and a phenolic stabilizer such as hydroquinone mono-methyl-ether or trihydroxy benzene. These additives serve to stabilize the composition and also provide means for bridging the polymerized carboxy terminated acrylate to itself and also to the alkene unsaturation of other components.

In the use of these alkene and carboxyl terminated polymers as photo resist compositions the polymer composition which includes a photoinitiator is coated onto the metal clad circuit board blank by any of the usual wet processing techniques. That is, the polymer composition can be thickened and applied to parts of the circuit board blank by screen printing, or it can be applied to the full circuit board blank and in a later step be selectively imaged. When the polymer composition is screen printed onto the circuit board blank it need only be exposed to actinic light to cure and solidify the polymer to create the photo resist. This cured polymer then protects the underlying metal during the subsequent plate resist or etch resist processing steps.

When the polymer composition is coated onto the full circuit board blank it is then selectively imaged in a subsequent step in order to cure the polymer in certain areas to a solid while the polymer which is not exposed remains liquid. This selective curing is accomplished by placing a photo tool, usually a negative of a circuit design, which has opaque areas and transparent areas above the coated surface. Actinic light is then focused onto the photo tool, passes through the photo tool in the transparent areas, and cures the polymer which it contacts to a solid. The polymer which is not contacted by the light remains liquid and is removed by wiping or by an alkaline wash. This cured polymer is firmly attached to the metal of the circuit board blank and protects the underlying metal during the subsequent plate resist or etch resist processing steps.

Whether screen printing or any other wet technique is used the cured polymer is stripped from the surface which it protects is the same manner. This consists of contacting the circuit board blank with an alkaline solution which contains cations derived from a strong base. These are solutions which contain cations which are reactive with the carboxyl group of the polymer. Suitable alkaline solutions are those which contain sodium, potassium or ammonium ions. Sodium hydroxide in a concentration of about 2 to 10 percent by weight is a preferred stripping solution.

Various modifications can be made to the present polymers, their method of synthesis, such as the reaction step sequence, or in the ways they can be used. However, any such modifications are within the skill of one in the art in view of the disclosures in this application for patent.

The following examples set forth the present invention in more detail:

EXAMPLE I

This example sets forth a process for making one of the preferred liquid polymer compositions.

A resin kettle is fitted with a stirrer, thermometer, drying tube and an addition funnel. 185 g of toluene diisocyanate (a mixture of 2,4 toluene diisocyanate and 2,6 toluene diisocyanate), 0.63 g of hydroquinone monomethyl ether (MEHQ); 5.8 g of triphenyl-phosphite and 0.15 g of dibutyl-tin dilaurate are added to this kettle. Upon heating the mixture to 30°–35° C., there is added dropwise 189 g of hydroxypropyl acrylate, allowing the mixture to exotherm to 65° C. The temperature is maintained between 60°–65° C. for 1½ hours at which time substantially all of the hydroxy groups are consumed, and the NCO content reaches 1.77±0.1 meg/g as determined by titration with dibutylamine. Thereafter, 785 g of poly (diethyleneglycol adipate) with a molecular weight of 1000 is added along with 0.15 g of dibutyltin dilaurate catalyst. The reaction mixture is held at 65° to 70° C. for approximately 3 hours until all the isocyanate groups are consumed.

385 g of hydroxyethyl methacrylate and 0.42 g of hydroquinone are then added to this mixture. When the reaction mixture has become uniform and the temperature has dropped to below 65° C., 248 g of solid maleic anhydride and 8 g of dibutyl-tin dilaurate are added. Slowly (over about an hour) the reaction mixture is heated up to 55° C. to dissolve the maleic anhydride. The heating is continued and held at 75° to 80° C. for approximately 6 hours until the maleic anhydride is completely reacted, as indicated by the absence of 1845 and 1975 cm$^{-1}$ peaks in an IR spectrograph. The final product thus obtained is a viscous liquid having viscosity of 5700 cps at 25° C. and acid group contents of 1.4 meq/g.

The prepolymer has the following composition:

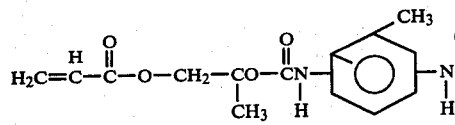

along with

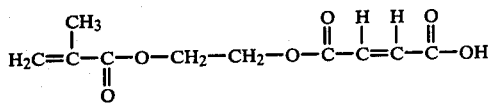

EXAMPLE II

This example sets forth a process for making one of the preferred liquid polymer compositions.

A resin kettle is fitted with a stirrer, thermometer, drying tube and an addition funnel. 177.4 g of toluene diisocyanate (a mixture of B 2,4 toluene diisocyanate and 2,6 toluene diisocyanate), 0.6 g of hydroquinone monomethyl ether (MEHQ); 5.6 g of triphenyl-phosphite and 0.18 g of dibutyl-tin dilaurate are added to this kettle. Upon heating the mixture to 30°-35° C., there is added dropwise 181.2 g of hydroxypropyl acrylate, allowing the mixture to exotherm to 65° C. The temperature is maintained between 60°-65° C. for 1½ hours at which time substantially all of the hydroxy groups are consumed, and the NCO content reaches 1.77±0.1 meg/g as determined by titration with dibutylamine. Thereafter, 752.4 g of melted poly (ethyleneglycol adipate) with a molecular weight of 1000 is added along with 0.15 g of dibutyltin dilaurate catalyst. The reaction mixture is held at 65° to 70° C. for approximately 6 hours until all the isocyanate groups are consumed.

366.4 g of hydroxyethyl methacrylate and 0.4 g of hydroquinone are then added to this mixture. When the reaction mixture has become uniform and the temperature has dropped to below 50° C., 237.8 g of solid maleic anhydride and 7.8 g of dibutyl-tin dilaurate are added. Slowly (over about an hour) the reaction mixture is heated up to 55° C. to dissolve the maleic anhydride. The heating is continued and held at 75° to 80° C. for approximately 6 hours until the maleic anhydride is completely reacted, as indicated by the absence of 1845 and 1975 cm−1 peaks in an IR spectrograph. The final product thus obtained is a viscous liquid having viscosity of 5500 cps at 25° C. and acid group contents of 1.4 meq/g.

EXAMPLE III

This example sets forth a process for making a hot melt polymer composition.

A resin kettle is fitted with a stirrer, thermometer, drying tube and an addition funnel. 129 g of hydroxyethyl methacrylate, 139 g of hexamethylene diisocyanate, 0.4 g of hydroquinone monomethyl ether (MEHQ); 3.2 g of triphenyl-phosphite and 0.08 g of pyrogallol are added to this kettle. Upon heating the mixture to 35°-40° C., there is added 0.04 g of stannous octoate, allowing the mixture to exotherm to 85° C. The temperature is maintained between 70°-75° C. for 2 hours at which time substantially all of the hydroxy groups are consumed, and the NCO content reaches 2.44±0.1 meg/g as determined by titration with dibutylamine. Thereafter, 74.4 g of polyethylene glycol with a molecular weight of 1500 followed by 457.7 g of poly (ethylene-glycol adipate) with a molecular weight of 1000 is added along with 0.09 g of stannous octoate. After the temperature reaches 60° C. there is added 0.12 g of stannous octoate and the reation mixture is held at 65° to 70° C. for approximately 6 hours until all the isocyanate groups are consumed.

22.7 g of maleic anhydride and 0.8 of hydroquinone and 4 g of dilutyl tin dilaurate are then added to this mixture. Slowly the reaction mixture is heated up to 55° C. to dissolve the maleic anhydride. The heating is continued and held at 70° to 75° C. for approximately 6 hours until the maleic anhydride is completely reacted, as indicated by the absence of 1845 and 1975 cm$^{-1}$ peaks in an IR spectrograph. The final product thus obtained is a solid at 25° C. and has an acid content of 0.29 meg/g.

EXAMPLE IV

This example sets forth the use of the polymer of Example III in a hot melt photopolymerizable composition.

The hot melt formulation has the following composition:

| Component | Percent By Weight |
|---|---|
| Polymer of Example III | 89 |
| Stearic Acid | 4.5 |
| Pentaerythritol tetra-kis (B-Mercaptopropionate) | 3.5 |
| Benzophenone | 0.9 |
| Irgacure, Irgazin Blue, DC-193 Surfactant and Hydroquinone monomethyl ether | 2.4 |

This composition is applied in about a 5 mil to a copper clad composite board by a drawdown bar at 55° to 60° C. Upon cooling the coating solidifies. A photographic negative of a desired circuit is then contacted to the surface of this polymer. The negative is exposed for 90 seconds to a medium pressure mercury vapor lamp at a distance to produce an intensity of about 25 milliwatts/cm$^2$. The board is then sprayed with an aqueous sodium lauryl sulfate solution to remove the unexposed polymer and selectively expose areas of the underlying copper cladding. The exposed copper cladding is removed by etching with a 3N hydrogen chloride-cupric chloride solution at 52° C. The copper is removed in about 2 mins. The board is rinsed with water and the cured polymer is removed by contact with a 5% aqueous sodium hydroxide solution at 55° C. The cured polymer is fully stripped in about 2 minutes exposing the underlying circuit.

EXAMPLE V

This example sets forth the use of the polymer composition of Example II as a screen-printable photocurable ink.

The screen-printable ink has the following formulation:

| Component | Percent By Weight |
|---|---|
| Polymer of Example II | 79.40 |
| Hydroxyethyl methacrylate | 0.98 |
| Irgacure | 2.94 |
| Benzophenone | 0.98 |
| Modaflow, Talc and Cabosil | 8.50 |
| Ethylene Glycol | 0.75 |
| Trimemethylol propane-tris-B-Mercaptopropionate) | 5.95 |
| Chromophtal Blue | 0.45 |

This composition is coated onto a copper clad composition board through a screen bearing the desired circuit design. The board is then exposed to two 80 watts/cm medium pressure mercury vapor lamps which are 46 cm apart and spaced about 7 cm above the board. The ink quickly cures to form the solid acid stable resist. The exposed copper is removed by etching at 52° C. with a ferric chloride solution. The board is water washed and contacted with a 5% aqueous sodium hydroxide solution at 52° C. The solid cured polymer is removed in about 20 seconds to expose the underlying circuit.

EXAMPLE VI

This example illustrates the use of the polymer of Example I in a photographic imaging process.

The imaging composition has the following formulation:

| Component | Percent By Weight |
|---|---|
| Polymer of Example I | 79.9 |
| Epoxy Acrylate | 6.9 |
| Benzophenone | 2.8 |
| Irgacure 651, Hydroquinone Monomethyl ether, Pyrogallol and Chromophlat Blue | 1.6 |
| Modaflow | 2.3 |
| Pentaerythritol tetra-kis-(β-Mercaptopropionate) | 6.5 |

This composition which has a Brookfield viscosity of 3,450 at 24° C., is coated onto a copper clad circuit board blank in a thickness of about 2 mils by means of drawdown. A negative of the desired circuit is then placed 10 mils above the liquid polymer surface and the negative is exposed to medium pressure mercury vapor light at an intensity of about 25 mil-watts/cm$^2$. The board is then washed with a 5% sodium carbonate at room temperature to remove the polymer which has remained liquid. After water rinsing the exposed copper is removed by etching using a 3N hydrochloric acid-cupric chloride solution at 52° C. The exposed copper is removed in about 1 to 2 minutes. The board is then water washed and contacted with a 5% aqueous sodium hydroxide solution at 55° C. for about 30 seconds. This solution removes the cured polymer to expose the underlying circuit.

EXAMPLE VII

This example illustrates another use of the polymer of Example I in a photographic imaging process.

The imaging composition has the following formulation:

| Component | Percent By Weight |
|---|---|
| The resin product of Example I | 61.7 |
| Epoxy Acrylate | 12.0 |
| Trimethylolpropane Triacrylate | 7.1 |
| Hexanediol Diacrylate | 4.8 |
| Pentaerythritol tetra-kis-(B-Mercaptopropionate) | 6.9 |
| Modaflow | 1.8 |
| Chromophtal Blue | 0.5 |
| Pyrogallol | 0.02 |
| Hydroquinone Mono-methyl ether | 0.04 |
| Irgacure 651 | 1.95 |
| Benzophenone | 2.91 |
| Triphenyl phosphite | 0.38 |

This composition which has a Brookfield viscosity of 4,500 at 24° C., is coated onto a copper clad circuit board blank in a thickness of about 2 mils by means of drawdown. A negative of the desired circuit is then placed 10 mils above the liquid polymer surface and the negative is exposed to medium pressure mercury vapor light at an intensity of about 25 mil-watts/cm$^2$. The board is then washed with 5% sodium carbonate at room temperature to remove the polymer which has remained liquid. After water rinsing the exposed copper is removed by etching using a 3N hydrochloric acid-cupric chloride solution at 52° C. The exposed copper is removed in about 1 to 2 minutes. The board is then water washed and contacted with a 5% aqueous sodium hydroxide solution at 55° C. for about 30 seconds. This solution removes the cured polymer to expose the underlying circuit.

The foregoing examples have been set forth to further illustrate the present invention. However, even though the examples are set forth using particular materials other equivalent materials can be used. For instance in place of hexanediol diacrylate other diacrylates such as tetraethylene glycol diacrylate, diethylene glycol diacrylate, triethylene glycol diacrylate, trimethylolpropane diacrylate and pentaerythritol triacrylate can be used.

Also in the foregoing examples the use of these polymer compositions has been illustrated for plate resist and etch resist processes. However, these polymer compositions can also be used as solder masks. They are sufficiently stable to molten solder temperatures. In such a usage the cured liquid polymer can be applied by screen printing or by the technique of coating the whole board and using a photo tool to selectively expose areas of the circuit board to actinic light to solidify the polymer in all areas except where solder is to be applied. In such a process any uncured polymer is removed and the exposed areas coated with solder. Usually after the solder is applied the cured polymer is left on the board to serve as an insulative and protective layer.

We claim:

1. A liquid polymer composition suitable for use as a photo resist comprising:
   (a) liquid polymer wherein the polymer consists eventually of a polymer having a single terminal alkene unsaturation at one end, a terminal carboxyl group at the other end, said carboxyl group and alkene unsaturation being in a ratio of about 1 to 1 a molecular weight of about 250 to 10,000, and an acid content of about 0.1 to 4.0 mille-equivalents/gram; and (b) an additive to control the viscosity of said liquid polymer and to enhance the alkaline stripability of the cured liquid polymer.

2. A liquid polymer composition suitable for use as a photo resist as in claim 1 wherein said polymer has the structure:

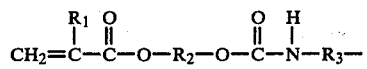

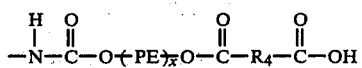

wherein $R_1$ is hydrogen, methyl or ethyl, $R_2$ is alkyl of from 1 to 6 carbon atoms, $R_3$ is alkyl, aryl or alkylaryl, (PE) is selected from the group consisting of polyethers, polyesters and mixtures thereof, x is an integer of from 2 to 50 and $R_4$ is alkyl, alkene, aryl or alicyclic.

3. A liquid polymer composition as in claim 2 wherein said additive has the structure:

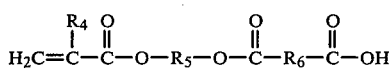

wherein $R_4$ is hydrogen, methyl or ethyl, $R_6$ is alkyl of from 1 to 6 carbon atoms and $R_6$ is alkyl, alkene, aryl or alicyclic.

4. A liquid polymer composition as in claim 2 suitable for use as a photo resist which includes a photoinitiator for promoting free radical generation.

5. A liquid polymer composition as in claim 4 suitable for use as a photo resist wherein said photoinitiator is selected from the group consisting of benzophenone, acetophenone, acenaphthenequinone, o-methoxy-benzophenone, dibenzosuberone, anthroquinone hexanophenone and 2,2-dimethoxy-2,2 phenyl acetophenone.

6. A liquid polymer composition as in claim 4 suitable for use as a photo resist which includes chain bridging agents selected from the group consisting of multifunctional acrylates and thiols.

7. A liquid polymer composition as in claim 6 suitable for use as a photo resist wherein said acrylate is hexanediol diacrylate and said thiol is pentaerythritoltetra-kis-(B mercaptopropionate).

8. A liquid polymer composition as in claim 4 suitable for use as a photo resist wherein $R_3$ is aryl and $R_4$ is ethylene.

9. A liquid polymer composition as in claim 4 suitable for use as a photo resist wherein in the structure of said additive $R_6$ is ethylene.

* * * * *